United States Patent
Lee et al.

(10) Patent No.: US 9,213,430 B2
(45) Date of Patent: Dec. 15, 2015

(54) TOUCH PANEL

(71) Applicants: Wu-Hsieh Lee, Hsin-Chu (TW);
Wei-Cheng Huang, Hsin-Chu (TW);
Chwen-Tay Hwang, Hsin-Chu (TW)

(72) Inventors: Wu-Hsieh Lee, Hsin-Chu (TW);
Wei-Cheng Huang, Hsin-Chu (TW);
Chwen-Tay Hwang, Hsin-Chu (TW)

(73) Assignee: Young Lighting Technology Inc.,
Hsin-Chu (TW)

( * ) Notice: Subject to any disclaimer, the term of this patent is extended or adjusted under 35 U.S.C. 154(b) by 138 days.

(21) Appl. No.: 13/968,443

(22) Filed: Aug. 16, 2013

(65) Prior Publication Data
US 2014/0092322 A1    Apr. 3, 2014

(30) Foreign Application Priority Data

Oct. 1, 2012 (TW) ............................. 101136240 A

(51) Int. Cl.
| | | |
|---|---|---|
| *G06F 3/041* | (2006.01) | |
| *G06F 3/044* | (2006.01) | |
| *G06F 3/045* | (2006.01) | |
| *H05K 3/32* | (2006.01) | |

(52) U.S. Cl.
CPC ............... *G06F 3/041* (2013.01); *G06F 3/044* (2013.01); *G06F 3/045* (2013.01); *G06F 3/0416* (2013.01); *G06F 2203/04103* (2013.01); *H05K 3/323* (2013.01)

(58) Field of Classification Search
CPC ......... G06F 3/044; G06F 3/045; G06F 3/041; G06F 3/0412; G06F 2203/04103; G06F 2203/04112; G02F 1/13338; G02F 1/133305; G02F 2202/28; G02F 2201/50; G02F 2201/133562; H03K 17/962; H05K 3/361; H05K 2201/0108; B32B 7/12; H01B 1/22
See application file for complete search history.

(56) References Cited

U.S. PATENT DOCUMENTS

| 5,278,276 A * | 1/1994 | Ohta et al. ..................... 528/125 |
| 8,487,904 B2 * | 7/2013 | Mi ................................. 345/174 |
| 8,716,932 B2 * | 5/2014 | Rappoport et al. ........... 313/512 |
| 2002/0071085 A1 * | 6/2002 | Huang et al. .................. 349/149 |

(Continued)

FOREIGN PATENT DOCUMENTS

| CN | 102122223 | 7/2011 |
| JP | 2004-334595 | 11/2004 |

(Continued)

OTHER PUBLICATIONS

English Translation of TW 200809311—Published Feb. 1, 2010 Authors: Yi Ching Chang, Yen An Ching.*

(Continued)

*Primary Examiner* — Nalini Mummalaneni
(74) *Attorney, Agent, or Firm* — Jianq Chyun IP Office

(57) ABSTRACT

A touch panel includes a transparent substrate and a touch module disposed thereon. The touch module includes a first stack structure that includes the following elements. A transparent carrying layer has an active area, an extending area, and a plurality of bending segments respectively connecting the active area and the extending area. A patterned conductive layer has an electrode pattern area and a plurality of bonding pads that extend from the electrode pattern area disposed on the active area. A plurality of extending wires connect the bonding pads, and extend to the extending area. A transparent adhesive layer covers the electrode pattern area. A wire protection layer covers a portion of each extending wire on the corresponding extending area. The transparent adhesive layer covers a portion of the bonding pads.

13 Claims, 13 Drawing Sheets

(56) References Cited

U.S. PATENT DOCUMENTS

| | | | |
|---|---|---|---|
| 2008/0158181 A1* | 7/2008 | Hamblin et al. | 345/173 |
| 2012/0092350 A1* | 4/2012 | Ganapathi et al. | 345/501 |
| 2013/0271828 A1* | 10/2013 | Everaerts et al. | 359/361 |
| 2014/0001023 A1* | 1/2014 | Guard | 200/600 |

FOREIGN PATENT DOCUMENTS

| | | |
|---|---|---|
| JP | 2007-272644 | 10/2007 |
| JP | 4251129 | 4/2009 |
| JP | 2011-022931 | 2/2011 |
| JP | 2011-039758 | 2/2011 |
| JP | 2013-218648 | 10/2013 |
| TW | 200809311 A * | 2/2008 |
| TW | I320114 | 2/2010 |
| TW | 201203036 | 1/2012 |
| TW | M420768 | 1/2012 |
| TW | 201220171 | 5/2012 |
| TW | 201222349 | 6/2012 |
| TW | 201232362 | 8/2012 |
| WO | 2012132846 | 10/2012 |
| WO | 2014041967 | 3/2014 |

OTHER PUBLICATIONS

"Office Action of Taiwan Counterpart Application", issued on Oct. 27, 2014, p. 1-p. 8.

"Office Action of Japan Counterpart Application", issued on Oct. 7, 2014, p. 1-p. 3.

* cited by examiner

TOUCH PANEL

CROSS-REFERENCE TO RELATED APPLICATION

This application claims the priority benefit of Taiwan application serial no. 101136240, filed on Oct. 1, 2012. The entirety of the above-mentioned patent application is hereby incorporated by reference herein and made a part of this specification.

BACKGROUND OF THE INVENTION

1. Field of the Invention

The invention relates to a touch panel.

2. Description of Related Art

With rapid developments and wide applications of information technologies, wireless mobile communications and information home appliances in recent years, touch panels have been introduced as input devices of operation interfaces of many information products in replacement of conventional input devices such as keyboards or mouses. Common touch panels are roughly classified into capacitive touch panels and resistance touch panels. Whether being applied to large flat panel displays (e.g. computer monitors, all-in-one computers and televisions) or handheld devices having small display panels (e.g. smartphones and tablet computers), touch panels usually achieve a signal transmission by a flexible circuit board. FIG. 14 is a schematic view of a conventional touch display device 20, wherein there is space left between a frame 21 and a display panel 22 or a touch panel 23 for bending of a flexible circuit board 24.

Taiwan patent publication no. 201232362 discloses forming traces on a flexible substrate of a touch panel while producing electrodes on the flexible substrate for connecting the bent flexible substrate to a next electronic element. Taiwan patent publication no. 201203036 discloses that a flexible circuit board is bent from a side edge of a touch panel to a back surface thereof. Taiwan patent no. 1320114 discloses reducing a bending stress of a flexible circuit board by an opening. China patent publication no. 102122223A discloses a connection relationship between a flexible circuit board and a touch panel.

SUMMARY OF THE INVENTION

The invention proposes a touch panel conducive to a better signal transmission performance.

Other objectives and advantages of the invention are further illustrated by the technical features disclosed in the invention.

To achieve one, a part of, or all of the above objectives, or other objectives, an embodiment of the invention provides a touch panel including a transparent substrate and a touch module disposed on the transparent substrate. The touch module includes a first stack structure including a transparent carrying layer, a patterned conductive layer, a plurality of extending wires, a transparent adhesive layer, and a wire protection layer. The transparent carrying layer has an active area, an extending area, and a plurality of bending segments respectively connecting the active area and the extending area. The patterned conductive layer is disposed on the transparent carrying layer. The patterned conductive layer has an electrode pattern area and a plurality of bonding pads extending from the electrode pattern area. The electrode pattern area and the bonding pads are disposed on the active area. The extending wires are disposed on the transparent carrying layer, and the extending wires respectively connect the bonding pads, and extend to the extending area. The transparent adhesive layer is disposed on the transparent carrying layer and covers the electrode pattern area. The wire protection layer is disposed on the transparent carrying layer and covers at least a portion of each extending wire on the extending area. The transparent adhesive layer further covers a portion of the bonding pads.

In an embodiment of the invention, the bonding pads respectively extend from the active area to the bending segments.

In an embodiment of the invention, the wire protection layer further covers a portion of each extending wire on the bonding pad.

In an embodiment of the invention, the transparent adhesive layer further covers a portion of each extending wire on the bonding pad.

In an embodiment of the invention, the touch module further includes an explosion-proof film, and the explosion-proof film is adhered to the patterned conductive layer of the first stack structure via the transparent adhesive layer of the first stack structure.

In an embodiment of the invention, the touch module further includes a second stack structure stacked on the first stack structure.

In an embodiment of the invention, the second stack structure further includes a transparent carrying layer, a patterned conductive layer, a plurality of extending wires, a transparent adhesive layer, and a wire protection layer. The transparent carrying layer has an active area, an extending area, and a plurality of bending segments respectively connecting the active area and the extending area. The patterned conductive layer is disposed on the transparent carrying layer. The patterned conductive layer has an electrode pattern area and a plurality of bonding pads extending from the electrode pattern area. The electrode pattern area and the bonding pads are disposed on the active area. The extending wires are disposed on the transparent carrying layer, and the extending wires respectively connect the bonding pads, and extend to the extending area. The transparent adhesive layer is disposed on the transparent carrying layer and covers the electrode pattern area. The wire protection layer is disposed on the transparent carrying layer and covers at least a portion of each extending wire on the extending area. The transparent adhesive layer further covers a portion of the bonding pads.

In an embodiment of the invention, an electrode pattern on the electrode pattern area of the second stack structure is complementary to an electrode pattern on the electrode pattern area of the first stack structure.

In an embodiment of the invention, the touch module further includes an explosion-proof film, and the explosion-proof film is adhered to the patterned conductive layer of the second stack structure via the transparent adhesive layer of the second stack structure.

In an embodiment of the invention, the patterned conductive layer is a transparent conductive layer.

In an embodiment of the invention, the transparent adhesive layer is an optically clear adhesive layer.

In an embodiment of the invention, the wire protection layer is a polyimide layer.

In an embodiment of the invention, a transmittance of the transparent adhesive layer is greater than a transmittance of the wire protection layer.

In an embodiment of the invention, the transmittance of the transparent adhesive layer is greater than 90%, and the transmittance of the wire protection layer is less than 90%.

Based on the above, the embodiments of the invention at least have one of the following advantages. In the above embodiments of the invention, since the transparent carrying layer has the extending area for disposing the extending wires coupled to a corresponding module circuit board via direct electricity, the additional conventional flexible circuit board is not used, and resistance is lowered so that the better signal transmission performance is obtained. In addition, by use of bending of the bending segments of the transparent carrying layer, a space for a side margin of the touch panel is reduced, and a stress caused by bending the transparent carrying layer is also reduced, so that completeness of the transparent carrying layer, the bonding pad, and the extending wire is maintained, which is conducive to a decrease in a width of a frame of the touch display device.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
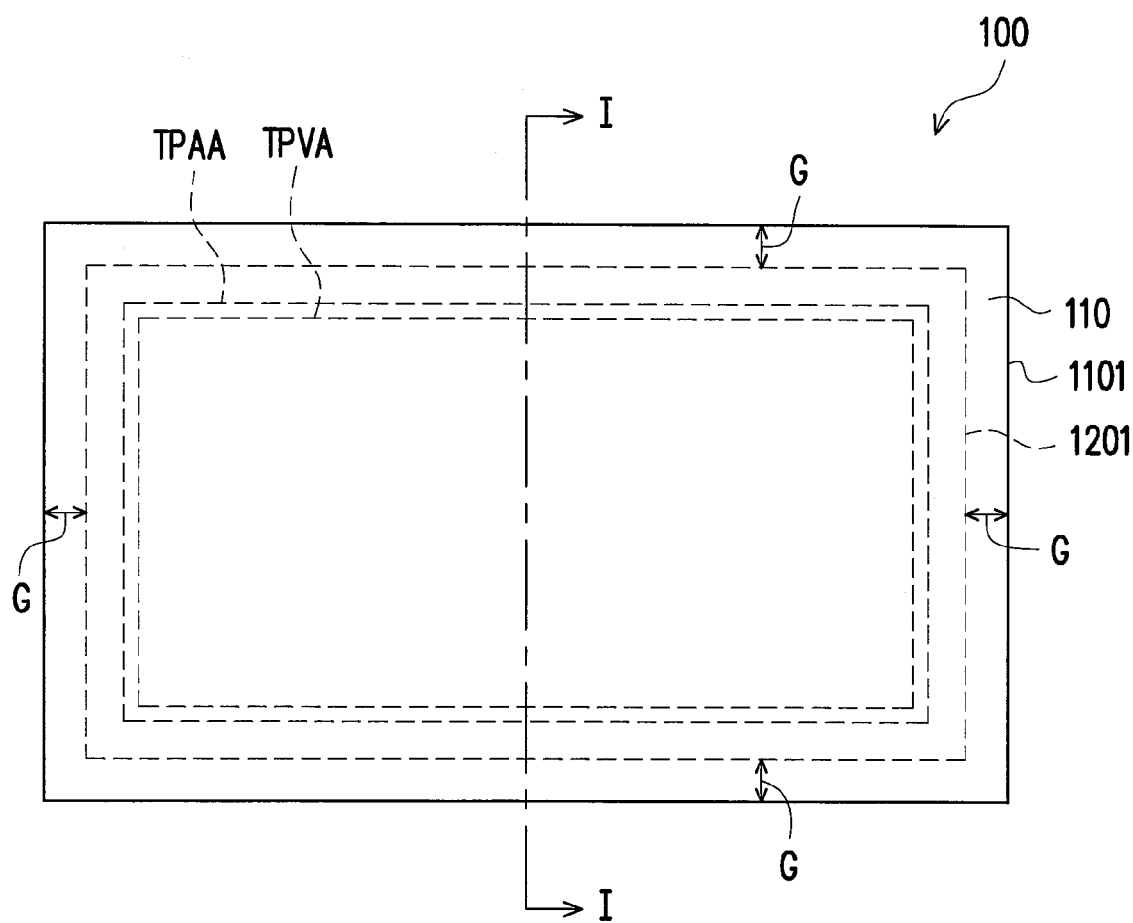
FIG. 1 is a front view of a touch panel according to an embodiment of the invention.
Figure 2:
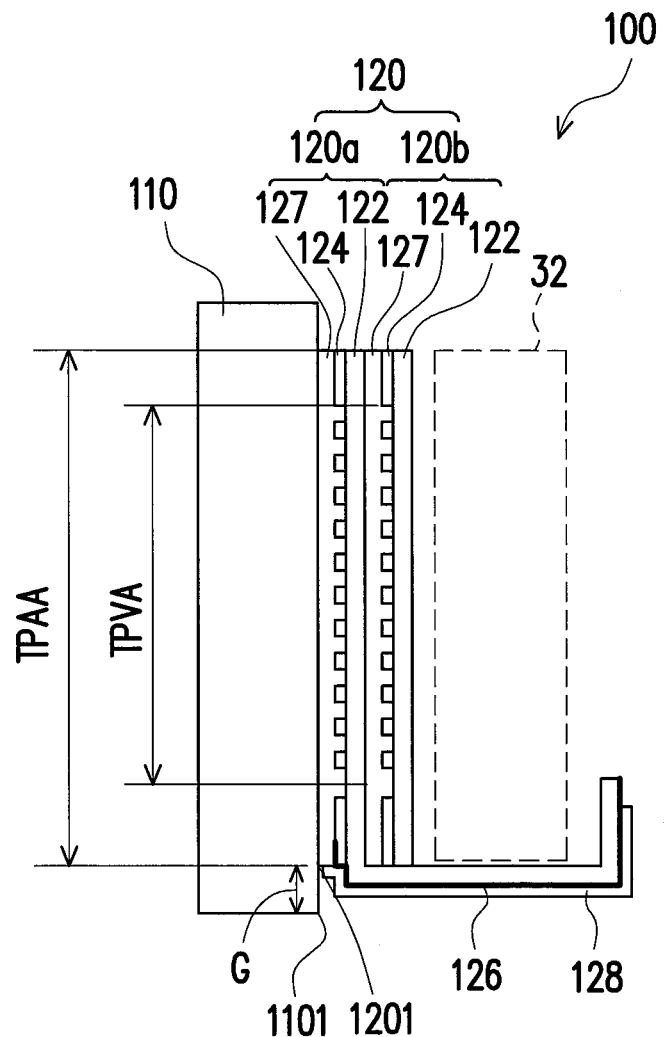
FIG. 2 is a cross-sectional view of the touch panel in FIG. 1 along a line I-I.

Referring to FIG. 1 and FIG. 2, a touch panel 100 of the embodiment is applicable to a display panel 32 to provide an operation interface for the display panel 32. The touch panel 100 includes a transparent substrate 110 and a touch module 120. The touch module 120 is disposed on the transparent substrate 110. The touch module 120 is a capacitive touch module or a resistance touch module. The touch module 120 has a touch panel view area TPVA and a touch panel active area TPAA. An orthographic projection 1201 of the touch module 120 on the transparent substrate 110 is located within an edge profile 1101 of the transparent substrate 110. There is a spacing G between a side edge of the orthographic projection 1201 of the touch module 120 on the transparent substrate 110 and a corresponding side edge of the transparent substrate 110. Therefore, a housing of a device to which the touch panel 100 is applied leans against or is connected to an edge of the transparent substrate 110. The touch module 120 includes a first stack structure 120a and a second stack structure 120b used to provide a row electrode and a column electrode respectively. However, in other embodiments not illustrated herein, the touch module 120 may merely include the first stack structure 120a depending on type or accuracy of the touch panel 100.

Figure 3:
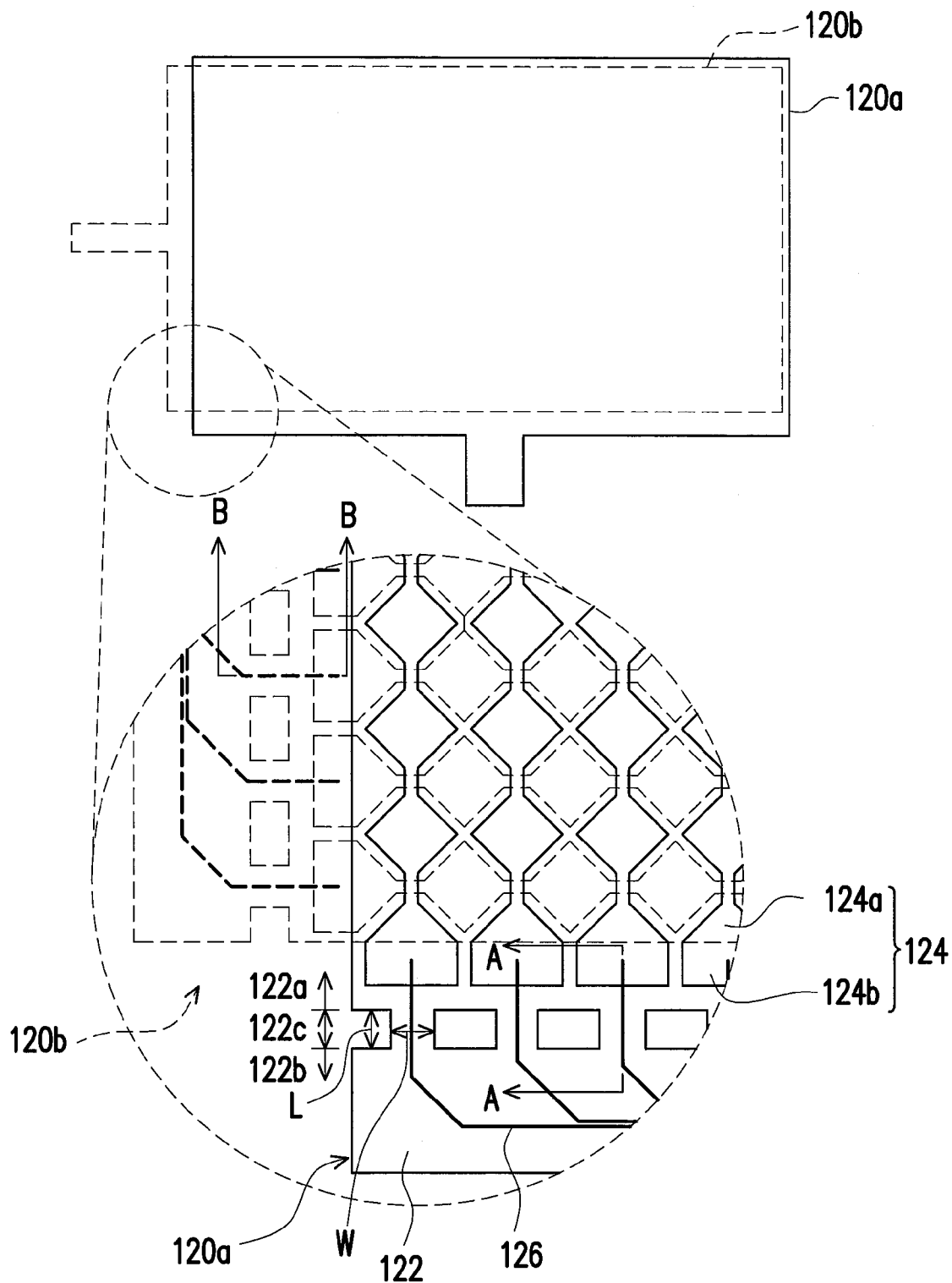
FIG. 3 is a front view of a first stack structure and a second stack structure in FIG. 1.
Figure 4:
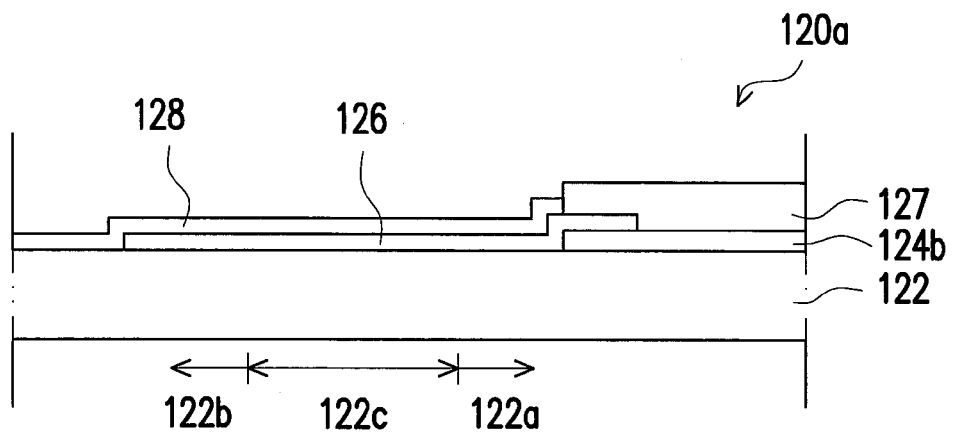
FIG. 4 is a cross-sectional view of the first stack structure in FIG. 3 along a line A-A.

Referring to FIG. 2, FIG. 3 and FIG. 4, the first stack structure 120a includes a transparent carrying layer 122, a patterned conductive layer 124, a plurality of extending wires 126, a transparent adhesive layer 127, and a wire protection layer 128. The transparent carrying layer 122 has an active area 122a, an extending area 122b, and a plurality of bending segments 122c. To more clearly show a structure of the patterned conductive layer 124, the transparent adhesive layer 127 and the wire protection layer 128 are not illustrated in FIG. 3. The active area 122a corresponds to the touch panel active area TPAA in FIG. 1. The bending segments 122c respectively connect the active area 122a and the extending area 122b. A space for a side margin of the touch panel 100 is reduced by bending of the bending segments 122c of the transparent carrying layer 122, so as to decrease a width of a frame of the applicable touch display device.

The patterned conductive layer 124 has an electrode pattern area 124a and a plurality of bonding pads 124b extending from the electrode pattern area 124a, wherein the electrode pattern area 124a is disposed on the active area 122a and the bonding pads 124b are disposed on the active area 122a.

The extending wires 126 (e.g. silver wires) respectively connect the bonding pads 124b and are disposed on the transparent carrying layer 122, and moreover, extend to the extending area 122b. Since the transparent carrying layer 122 has the extending area 122b for disposing the extending wires 126 coupled to a corresponding module circuit board (not illustrated) via direct electricity, the additional conventional flexible circuit board (FPC) is not used, and resistance is lowered so that a better signal transmission performance is obtained. The transparent adhesive layer 127 is disposed on the transparent carrying layer 122 and covers the electrode pattern area 124a. The wire protection layer 128 is disposed on the transparent carrying layer 122 and covers at least a portion of each extending wire 126 on the extending area 122b. The transparent adhesive layer 127 covers the bonding pads 124b and a portion of the extending wires 126 on the bonding pads 124b. In detail, the bending segment 122c of each transparent carrying layer 122 has a length L and a width W. That is, a distance between the active area 122a and the extending area 122b is the length L (i.e. the length of the bending segment 122c), and the width of a single bending segment 122c is W. To reduce a stress caused by bending the transparent carrying layer 122 and further to maintain completeness of the transparent carrying layer 122, the bonding pad 124b, and the extending wire 126, the length L is increased or the width W is decreased, or the length L is increased at the same time when the width W is decreased, depending on actual design.

In the embodiment, the patterned conductive layer 124 is a transparent conductive layer, such as a transparent and conductive metal compound, for example, indium tin oxide, or a transmittance-improving ultra-thin metal wire. The transparent adhesive layer 127 is an optically clear adhesive layer. The optically clear adhesive is generally classified into optical clear adhesive (OCA) in a film shape and optically clear resin (OCR) in a liquid state. The wire protection layer 128 is a polyimide layer (PI layer). A transmittance of the wire protection layer 128 is less than a transmittance of the transparent adhesive layer 127. For example, the transmittance of the transparent adhesive layer 127 is greater than 90% while the transmittance of the wire protection layer 128 is less than 90%.

Figure 5:
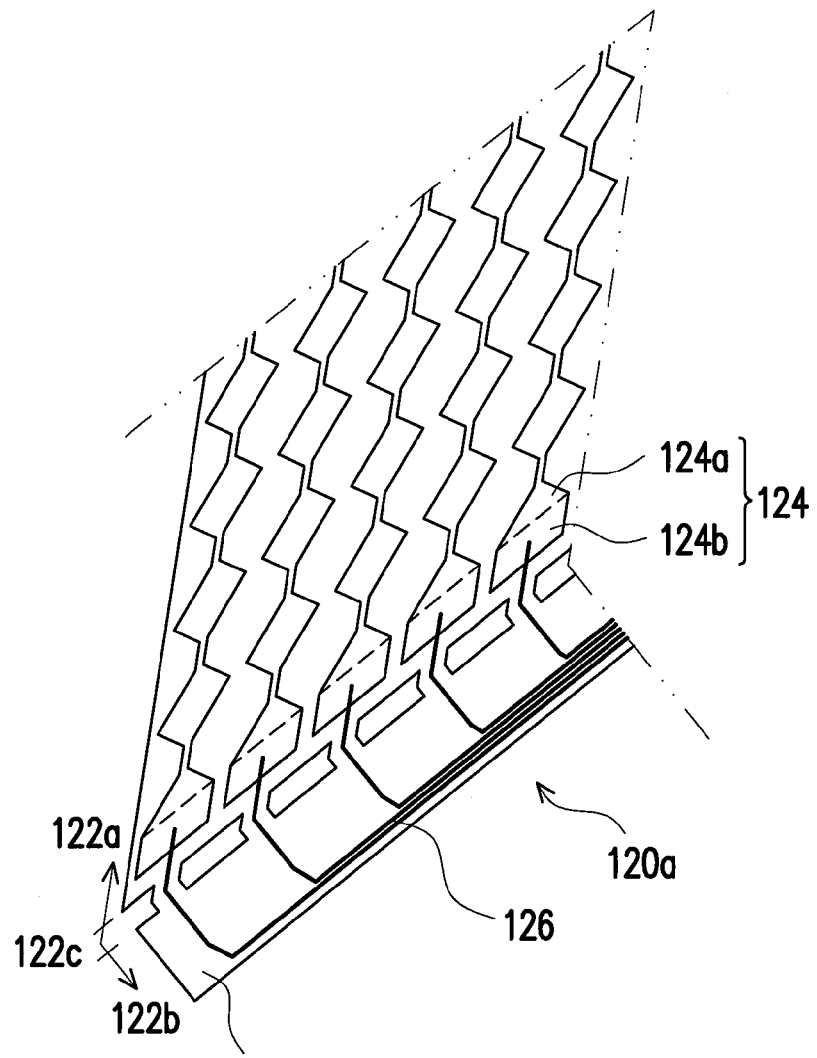
FIG. 5 is a partial three-dimensional view of the first stack structure in FIG. 3.

Referring to FIG. 2 and FIG. 5, the bending segments 122c of the transparent carrying layer 122 of the first stack structure 120a are bendable, so as to fold the extending area 122b relatively to the active area 122a of the transparent carrying layer 122.

Figure 6:
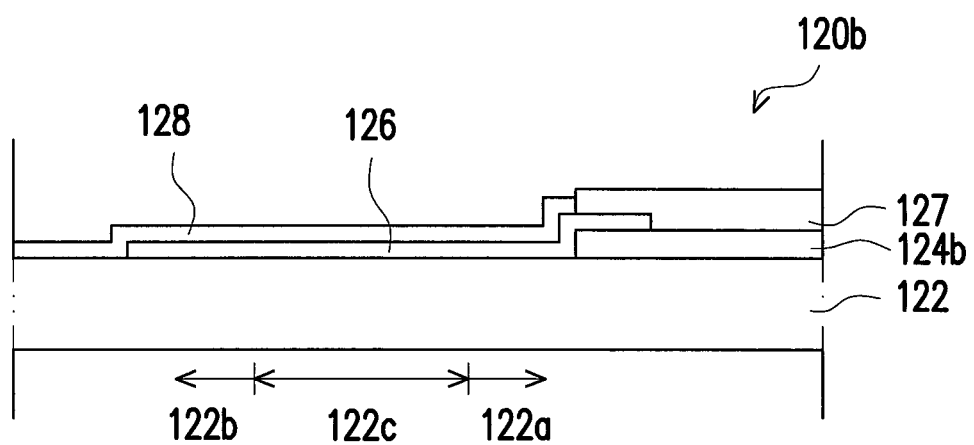
FIG. 6 is a cross-sectional view of the second stack structure in FIG. 3 along a line B-B.

Referring to FIG. 2, FIG. 3, and FIG. 6, in FIG. 2 and FIG. 3, the second stack structure 120b is represented by dashed lines to be distinguished from the first stack structure 120a. The second stack structure 120b is stacked on the first stack structure 120a. The second stack structure 120b has a similar structural arrangement to the first stack structure 120a. The second stack structure 120b also includes the transparent carrying layer 122, the patterned conductive layer 124, the plurality of extending wires 126, the transparent adhesive layer 127, and the wire protection layer 128. In another embodiment of the invention, an electrode pattern on the electrode pattern area 124a of the first stack structure 120a is complementary to an electrode pattern on the electrode pattern area 124a of the second stack structure 120b, as shown in FIG. 3.

Figure 7:
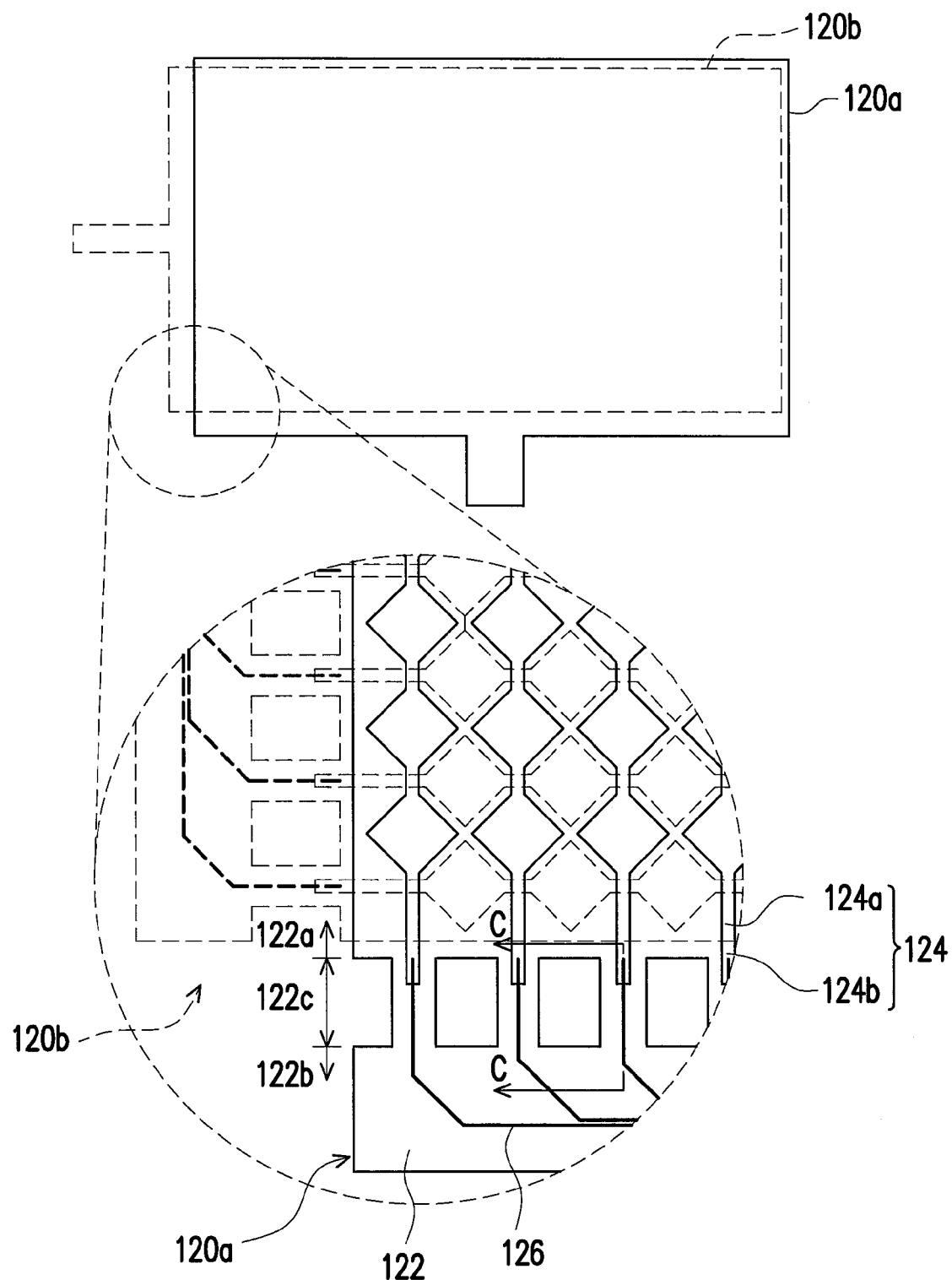
FIG. 7 is a front view of a first stack structure and a second stack structure of a touch panel according to another embodiment of the invention.
Figure 8:
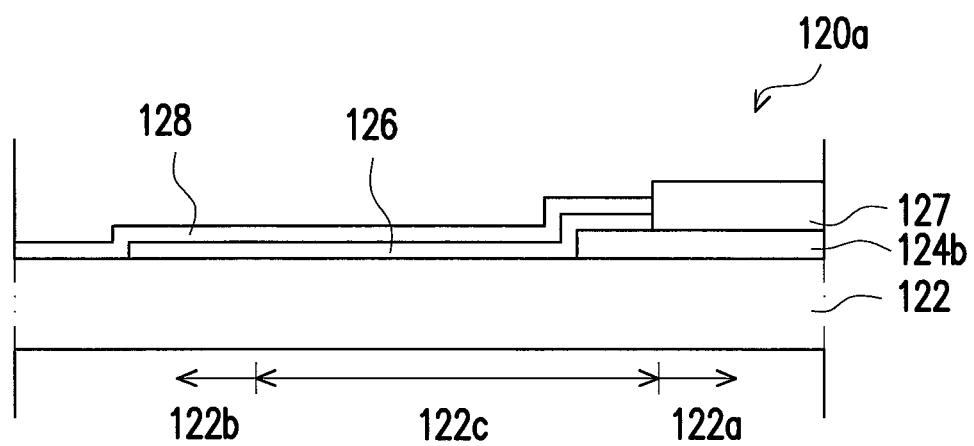
FIG. 8 is a cross-sectional view of the first stack structure in FIG. 7 along a line C-C.

Referring to FIG. 7 and FIG. 8, to more clearly show the structure of the patterned conductive layer 124, the transparent adhesive layer 127 and the wire protection layer 128 are not illustrated in FIG. 7. Compared to the first stack structure 120a of the embodiments in FIG. 2 and FIG. 3, the bonding pads 124b of the embodiment respectively extend from the active area 122a to be disposed on the bending segments 122c. The transparent adhesive layer 127 covers a portion of the bonding pads 124b, and the wire protection layer 128 covers a portion of each extending wire 126 on the bonding pad 124b.

Figure 9:
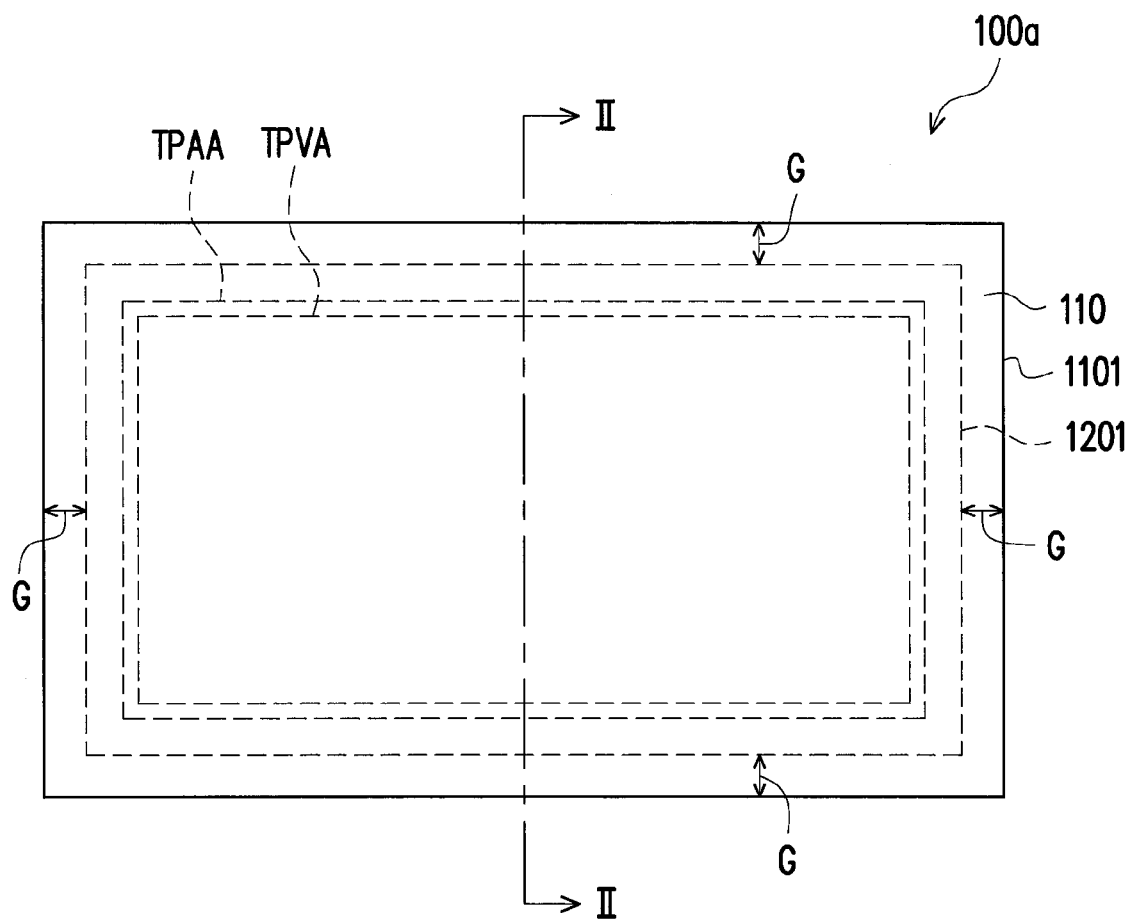
FIG. 9 is a front view of a touch panel according to another embodiment of the invention.
Figure 10A:
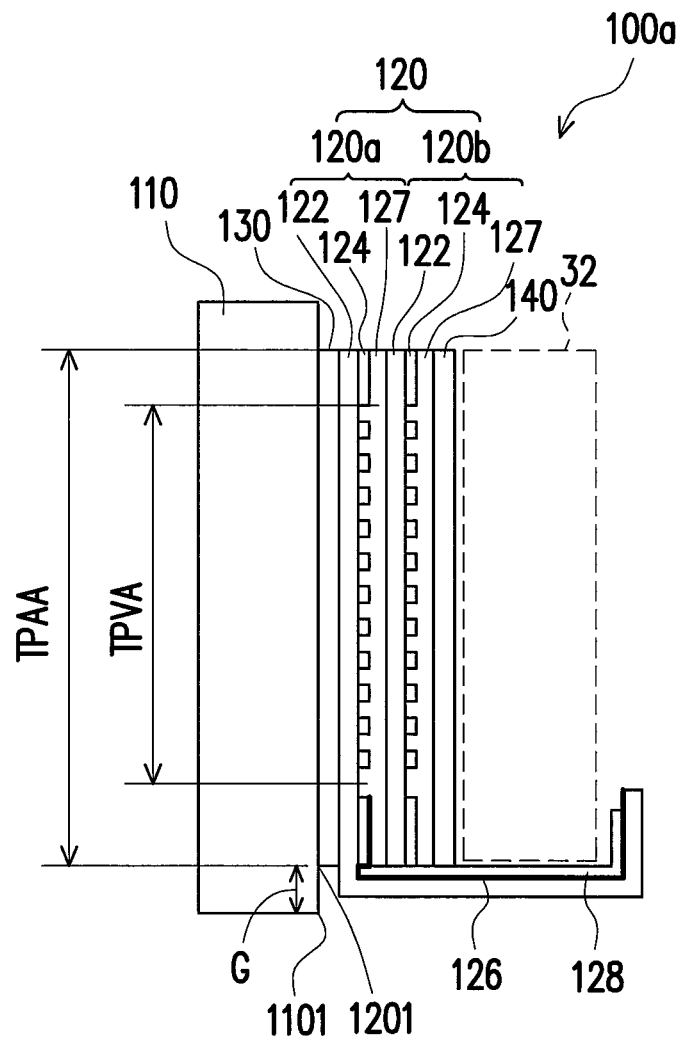
FIG. 10a is a cross-sectional view of the touch panel in FIG. 9 along a line II-II.

Referring to FIG. 9 and FIG. 10a, a touch panel 100a of the embodiment has a similar structural arrangement to the touch panel 100 in FIG. 2. A main difference between the touch panel 100a of the embodiment and the touch panel 100 in FIG. 2 is that the touch panel 100a of the embodiment additionally has an explosion-proof film 140.

Figure 10B:
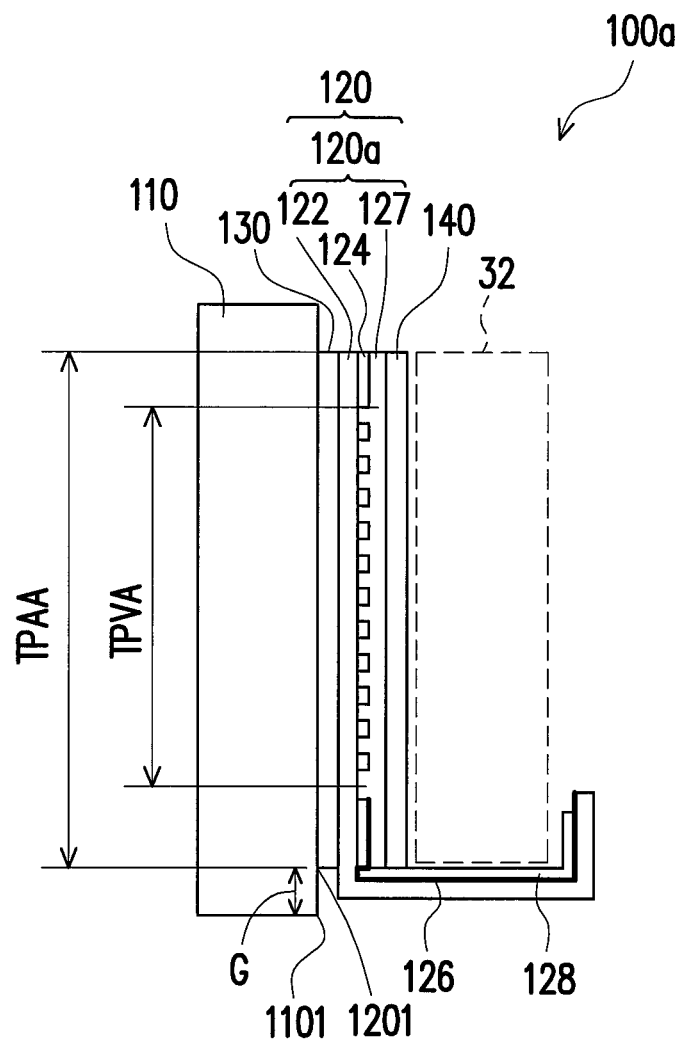
FIG. 10b is a cross-sectional view of a touch panel according to another embodiment of the invention.

In addition, the touch panel 100a of the embodiment differs from the touch panel 100 in FIG. 2 in an adhesion surface between the first stack structure 120a of the touch module 120 and the transparent substrate 110 in the touch panel 100a of the embodiment. In detail, the touch module 120 of the touch panel 100a of the embodiment further includes a transparent adhesive layer 130, and the transparent carrying layer 122 of the first stack structure 120a is adhered to the transparent substrate 110 via the transparent adhesive layer 130. When the transparent carrying layer 122 of the first stack structure 120a is disposed beside the transparent substrate 110, the patterned conductive layer 124 furthest from the transparent substrate 110, i.e. the patterned conductive layer 124 of the second stack structure 120b is disposed on the back of a surface of the transparent carrying layer 122 facing the transparent substrate 110, i.e. on a surface of the transparent carrying layer 122 facing the display panel 32, the patterned conductive layer 124 is exposed outside. To prevent the patterned conductive layer 124 of the second stack structure 120b from oxidizing, the touch module 120 further includes the explosion-proof film 140. The explosion-proof film 140 is adhered to the patterned conductive layer 124 of the second stack structure 120b via the transparent adhesive layer 127 of the second stack structure 120b. Referring to FIG. 10b, in another embodiment of the invention, the touch module 120 merely includes the first stack structure 120a. According to the difference in the adhesion surface between the first stack structure 120a and the transparent substrate 110, the explosion-proof film 140 is selectively disposed. For example, when the transparent carrying layer 122 of the first stack structure 120a is disposed beside the transparent substrate 110, the patterned conductive layer 124 furthest from the transparent substrate 110, i.e. the patterned conductive layer 124 of the first stack structure 120a is disposed on the back of the surface of the transparent carrying layer 122 facing the transparent substrate 110, i.e. on the surface of the transparent carrying layer 122 facing the display panel 32. Moreover, the explosion-proof film 140 is adhered to the patterned conductive layer 124 of the first stack structure 120a via the transparent adhesive layer 127 of the first stack structure 120a.

Figure 11:
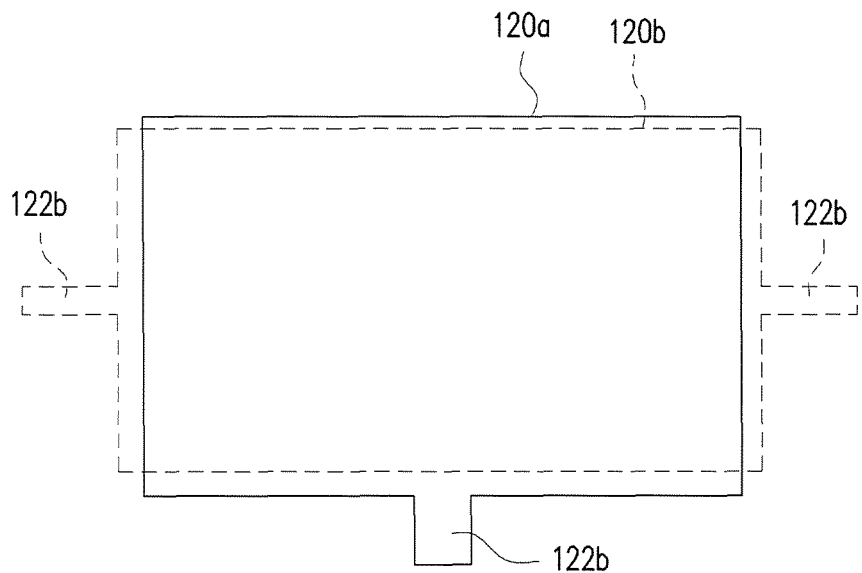
FIG. 11 is a front view of a first stack structure and a second stack structure of a touch panel according to another embodiment of the invention.

Referring to FIG. 11, compared to the first stack structure 120a and the second stack structure 120b in FIG. 3, the second stack structure 120b of the embodiment in FIG. 11 further includes another extending area 122b, and the two extending areas 122b are disposed opposing to each other.

Figure 12:
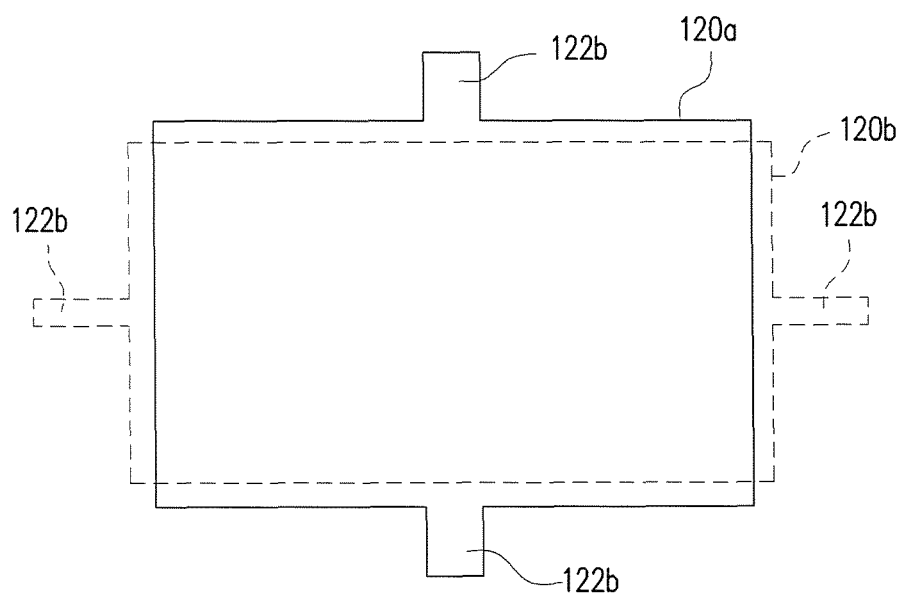
FIG. 12 is a front view of a first stack structure and a second stack structure of a touch panel according to another embodiment of the invention.

Referring to FIG. 12, compared to the first stack structure 120a and the second stack structure 120b in FIG. 11, the first stack structure 120a of the embodiment in FIG. 12 further includes another extending area 122b, and the two extending areas 122b of the first stack structure 120a are disposed opposing to each other.

Figure 13:
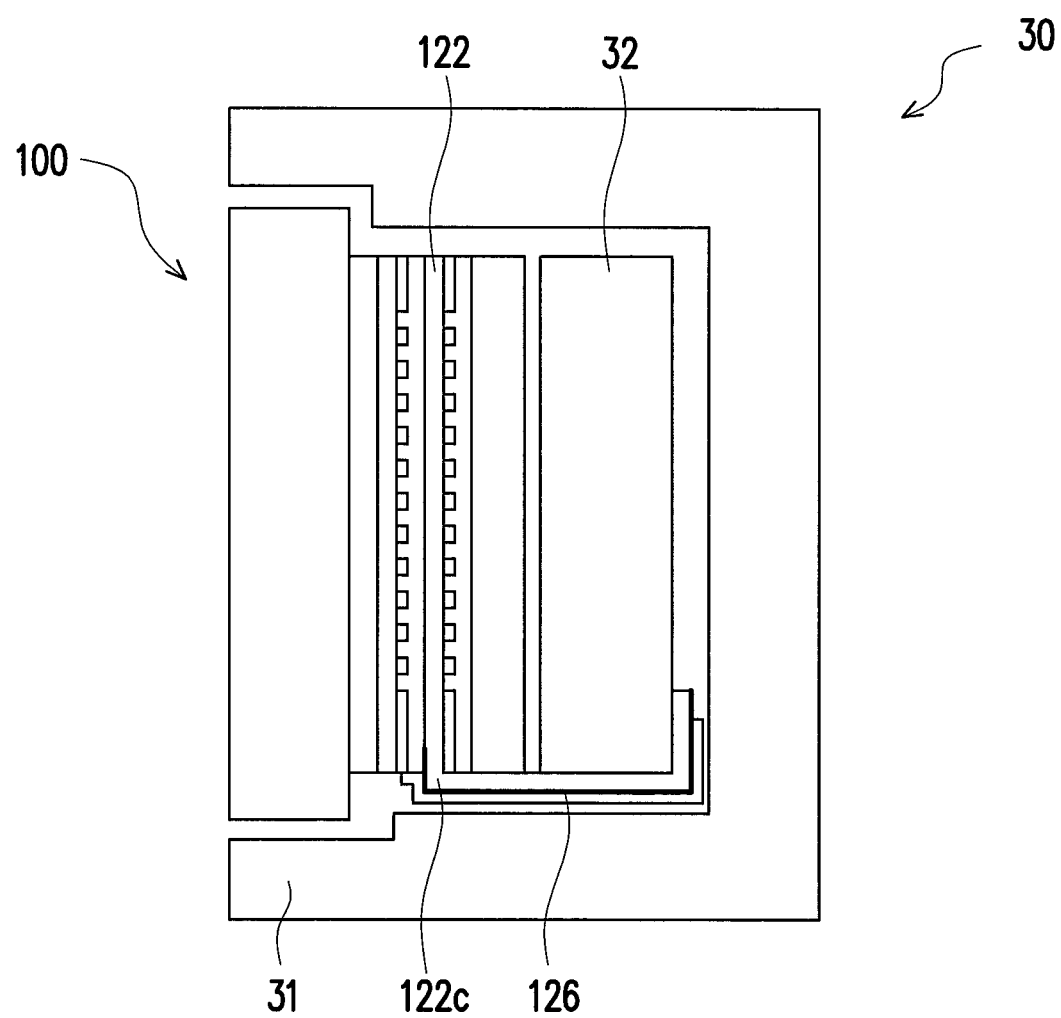
FIG. 13 is a schematic view of a touch panel being placed in a frame according to another embodiment of the invention.
Figure 14:
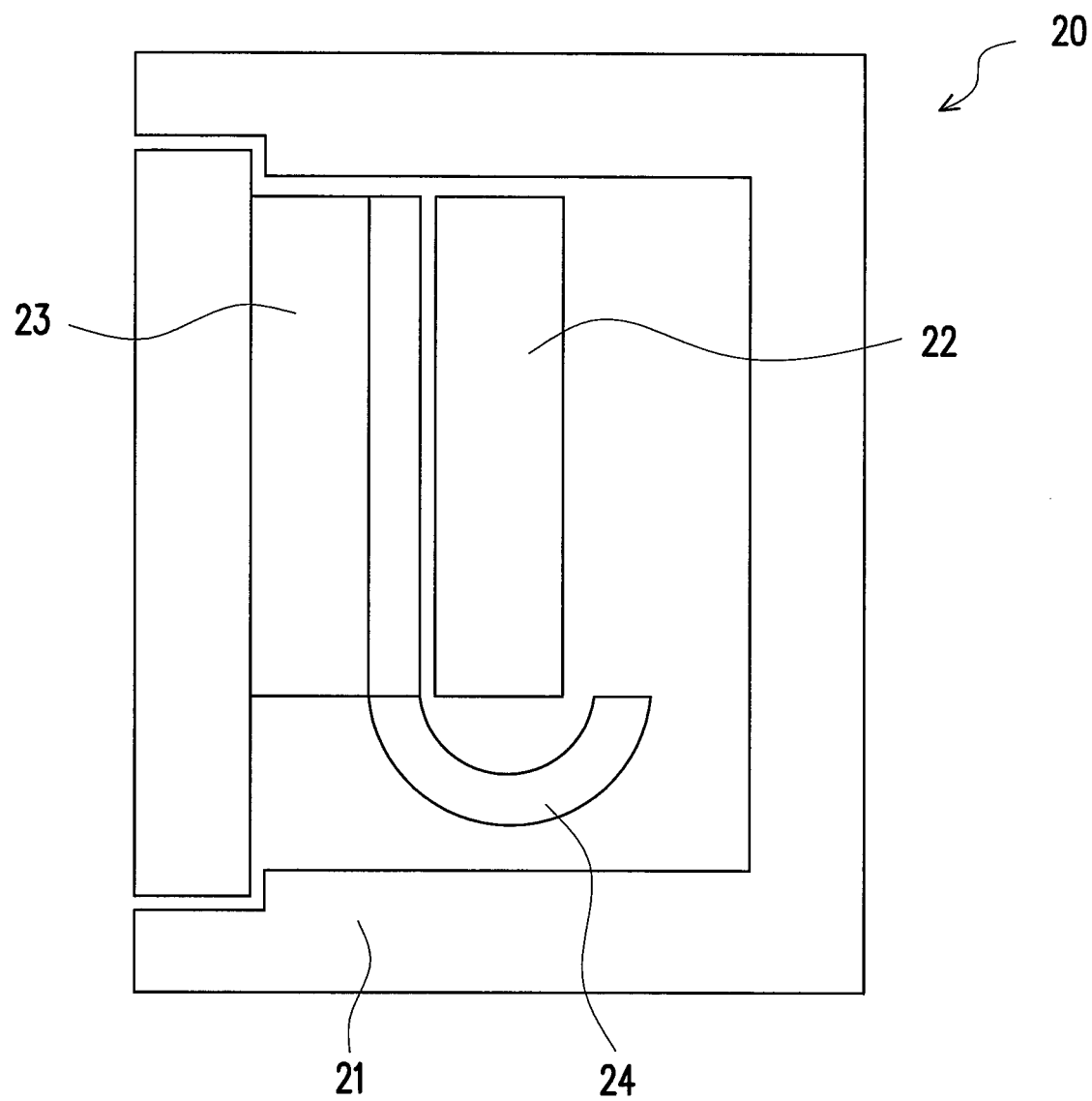
FIG. 14 is a schematic view of a conventional touch display device.

Referring to FIG. 13, in the embodiment, the touch panel 100 is usually assembled onto a housing to create a touch display device 30 before being provided to a consumer, so as to protect the touch panel 100 and circuits therein. Since the transparent carrying layer 122 of the embodiment is directly bendable by having the plurality of bending segments 122c, after the touch panel 100 is placed in a frame 31, there is sufficient space between the frame 31 and the touch panel 100, and accordingly, a larger stress caused by the frame 31 pressing the transparent carrying layer 122 is avoided so as to prevent the transparent carrying layer 122 from breaking, and further to prevent the extending wire 126 or the bonding pad 124b from being destroyed. Therefore, it is not necessary to leave too much space between the frame 31 and the touch panel 100. The frame 31 may be set to have the same size as the touch panel 100 and a width of a frame surrounding the touch display device 30 is shortened.

In summary, in the above embodiments of the invention, since the transparent carrying layer has the extending area for disposing the extending wires coupled to a corresponding module circuit board via direct electricity, the additional conventional flexible circuit board is not used, and resistance is lowered so that the better signal transmission performance is obtained. In addition, by use of the bending of the bending segments of the transparent carrying layer, the space for the side margin of the touch panel is reduced, and the stress caused by bending the transparent carrying layer is also reduced, so that completeness of the transparent carrying layer, the bonding pad, and the extending wire is maintained, which is conducive to a decrease in the width of the frame of the touch display device.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch panel, comprising:
a transparent substrate; and
a touch module disposed on the transparent substrate, the touch module comprising:
a first stack structure, comprising:
a transparent carrying layer having an active area, an extending area, and a plurality of bending segments respectively connecting the active area and the extending area;
a patterned conductive layer disposed on the transparent carrying layer, the patterned conductive layer having an electrode pattern area and a plurality of bonding pads extending from the electrode pattern area, wherein the electrode pattern area and the bonding pads are disposed on the active area;
a plurality of extending wires disposed on the transparent carrying layer, the extending wires respectively connecting the bonding pads and extending to the extending area;
a transparent adhesive layer disposed on the transparent carrying layer, the transparent adhesive layer covering the electrode pattern area; and
a wire protection layer disposed on the transparent carrying layer, the wire protection layer covering at least a portion of each extending wire on the extending area, wherein the transparent adhesive layer further covers a portion of the bonding pads, and the wire protection layer further covers a portion of each extending wire on the bonding pad.

2. The touch panel according to claim 1, wherein the bonding pads respectively extend from the active area to the bending segments.

3. The touch panel according to claim 1, wherein the transparent adhesive layer further covers a portion of each extending wire on the bonding pad.

4. The touch panel according to claim 1, wherein the touch module further comprises an explosion-proof film, and the explosion-proof film is adhered to the patterned conductive layer of the first stack structure via the transparent adhesive layer of the first stack structure.

5. The touch panel according to claim 1, wherein the touch module further comprises:
a second stack structure stacked on the first stack structure.

6. The touch panel according to claim 5, wherein the second stack structure further comprises:
a transparent carrying layer having an active area, an extending area, and a plurality of bending segments respectively connecting the active area and the extending area;
a patterned conductive layer disposed on the transparent carrying layer, the patterned conductive layer having an electrode pattern area and a plurality of bonding pads extending from the electrode pattern area, wherein the electrode pattern area and the bonding pads are disposed on the active area;

a plurality of extending wires disposed on the transparent carrying layer, the extending wires respectively connecting the bonding pads and extending to the extending area;

a transparent adhesive layer disposed on the transparent carrying layer, the transparent adhesive layer covering the electrode pattern area; and a wire protection layer disposed on the transparent carrying layer, the wire protection layer covering at least a portion of each extending wire on the extending area, wherein the transparent adhesive layer further covers a portion of the bonding pads.

7. The touch panel according to claim 6, wherein an electrode pattern on the electrode pattern area of the second stack structure is complementary to an electrode pattern on the electrode pattern area of the first stack structure.

8. The touch panel according to claim 6, wherein the touch module further comprises:

an explosion-proof film adhered to the patterned conductive layer of the second stack structure via the transparent adhesive layer of the second stack structure.

9. The touch panel according to claim 1, wherein the patterned conductive layer is a transparent conductive layer.

10. The touch panel according to claim 9, wherein the transmittance of the transparent adhesive layer is greater than 90%, and the transmittance of the wire protection layer is less than 90%.

11. The touch panel according to claim 1, wherein the transparent adhesive layer is an optically clear adhesive layer.

12. The touch panel according to claim 1, wherein the wire protection layer is a polyimide layer.

13. The touch panel according to claim 1, wherein a transmittance of the transparent adhesive layer is greater than a transmittance of the wire protection layer.

* * * * *